United States Patent
Tsao et al.

[11] Patent Number: 5,621,329
[45] Date of Patent: Apr. 15, 1997

[54] AUTOMATIC SELF-CALIBRATION SYSTEM FOR DIGITAL TERAOHMMETER

[75] Inventors: Sai-Hoi Tsao; Chun-Chun Chen; Yu-Chuang Lin, all of Chutung, Taiwan

[73] Assignee: Industrial Technology Research Institute, Hsinchu, Taiwan

[21] Appl. No.: 421,444

[22] Filed: Apr. 13, 1995

[51] Int. Cl.⁶ .................................................. G01R 27/02
[52] U.S. Cl. ..................... 324/601; 324/607; 324/678; 324/711; 341/120
[58] Field of Search ............................ 341/120; 324/711, 324/678, 677, 601, 607

[56] References Cited

U.S. PATENT DOCUMENTS

| | | | |
|---|---|---|---|
| 3,490,039 | 1/1970 | Tsao | 324/711 |
| 4,799,041 | 1/1989 | Layton | 341/120 |
| 5,101,206 | 3/1992 | Riedel | 341/120 |
| 5,321,403 | 6/1994 | Eng | 341/120 |

*Primary Examiner*—Kenneth A. Wieder
*Assistant Examiner*—Jose M. Solis
*Attorney, Agent, or Firm*—Bacon & Thomas

[57] ABSTRACT

An automatic self-calibration system for digital teraohmmeter wherein a built-in standard resistor is provided. The system is able to calibrate the values of the key components by taking the standard resistor as reference. The calibration procedure of the invention is controlled by a computer and executed automatically. The system is used to measure high-resistance standards up to $10^{15}$ $\Omega$ where the standard uncertainty does not exceed 100 ppm after a traceable calibration.

7 Claims, 3 Drawing Sheets

$\gamma = 0.1$ $\beta1 : \beta2 : \beta3 = 1/90 : 1/10 : 9/10$ $C = 900pF, 8100pF$ or $100pF$

AUTOMATIC SELF-CALIBRATION SYSTEM FOR DIGITAL TERAOHMMETER

FIELD OF THE INVENTION

The present invention relates to an automatic self-calibration system for a digital teraohmmeter, and especially to an automatic self-calibration device and method applicable to integrating high-resistance measuring apparatus. The automatic self-calibration system of this invention may execute the calibration automatically at any time before the measurement procedure by the digital teraohmmeter. The automatic self-calibration system for the digital teraohmmeter of this invention is able to measure high-resistance standards up to $10^{15}$ $\Omega$ where the standard uncertainty does not exceed 100 ppm after a traceable calibration.

BACKGROUND OF THE INVENTION

The integrator approach is one of the most popular approaches in the field of high-resistance measurement. When applied to the measurement of high-resistance, this approach avoids several innate drawbacks of high-resistance devices.

The integrator approach employs the principle of an analog integrator by recording the time during which the level of the output terminal of the integrator changes to another level as the "integrating time" and using the integrating time as a basis to give the value of a device having a high-resistor. The resistance value is then displayed on the screen of the teraohmmeter.

FIG. 1 is illustrates a block diagram of a conventional teraohmmeter. In this figure, 1 represents a DC voltage source which supplies DC voltage to the resistor, 2 is a circuit for providing reference voltages and a test voltage, 3 is an operational amplifier, 4 is a level comparator which compares the test and reference voltages or levels, 5 is a counter, 6 is a standard frequency generator which generates a standard frequency, and 7 is a gate. $R_X$ represents the test resistor which is a device with high resistance to be measured. The voltage as provided by the DC voltage 1 is divided by circuit 2 into a reference voltages $V_1$ and $V_2$ and a test voltage $V_T$ at the ratio 2. The test voltage $V_T$ is transmitted through the test resistor $R_X$ and integrated at the operational amplifier 3, and reaches the level comparator 4. Relay $RL_1$ is used to start/stop the integrating operation. C is an integrating capacitor.

Under normal conditions, the relay $RL_1$ is closed and the capacitor C is precharged. During measurement, the relay $RL_1$ is open and the integrating process is started. The level comparator 3 compares the voltage $V_0$ and the counter 5 counts the integrating time dt of the voltage $V_0$, as the reference it changes from $V_1$ to $V_2$, according to the signals generated by the standard frequency generator 6. The integrating time is then provided to a calculation device (not shown). The calculation device calculates the resistance value of the resistor $R_X$ according to the equation as described hereinafter.

The calculation of the resistance $R_X$ includes the following equation:

Given that $R_X$ represents the resistance value of the resistor, $i_R$ represents the current of the output terminal of the resistor $R_X$, $V_T$ is the voltage of the input terminal of the resistor $R_X$, the capacitance of the capacitor C is C, the voltage difference of the operational amplifier 3 is $dV_0$ and the integrating time is dt, then:

According to the principle of the operational amplifier:

$$i_R = C \frac{dV_0}{dt} \text{. Because } i_R = \frac{V_T}{R_X} \text{, and}$$

$$\frac{V_T}{R_X} = C \frac{dV_0}{dt} \text{, so that}$$

$$R_X = \frac{V_T}{dV_0} \cdot \frac{dt}{C} \, . \tag{1}$$

The value of $R_X$ may be given from the value of C, dt and the voltage ratio $V_T/dV_0$.

In the conventional teraohmmeter as described above, the resistance value $R_X$ is a function of the integrating capacitance C. As a result, the accuracy of the measurement of the resistor $R_X$ is dependent on the accuracy and stability of the integrating capacitor C. When a drift happens in the integrating capacitor C, accurate measurement of the resistor $R_X$ may not be achieved.

OBJECTS OF THE INVENTION

It is thus an object of this invention to provide a digital teraohmmeter wherein self-calibration and in particular calibration of the capacitance used as the standard for calculating a resistance by integrating may be carried out automatically.

Another object of this invention is to provide a digital teraohmmeter with self-calibration functions but without the need for complicated circuitry.

SUMMARY OF THE INVENTION

According to this invention, a digital teraohmmeter is provided wherein a built-in standard resistor is taken for reference in calibrating the capacitance used in resistance calculating and a special self-calibration procedure is used to calibrate the digital teraohmmeter automatically.

The above and other objects and advantages of this invention may be clearly understood according to the detailed specification of the invention by referring to the following drawings.

Table I records the self-calibration process and the results of calibration of the automatic self-calibration method for digital teraohmmeter of this invention.

DETAILED DESCRIPTION OF THE INVENTION

The following is a detailed description of the automatic self-calibration system and method for digital teraohmmeter of this invention.

Figure 1:
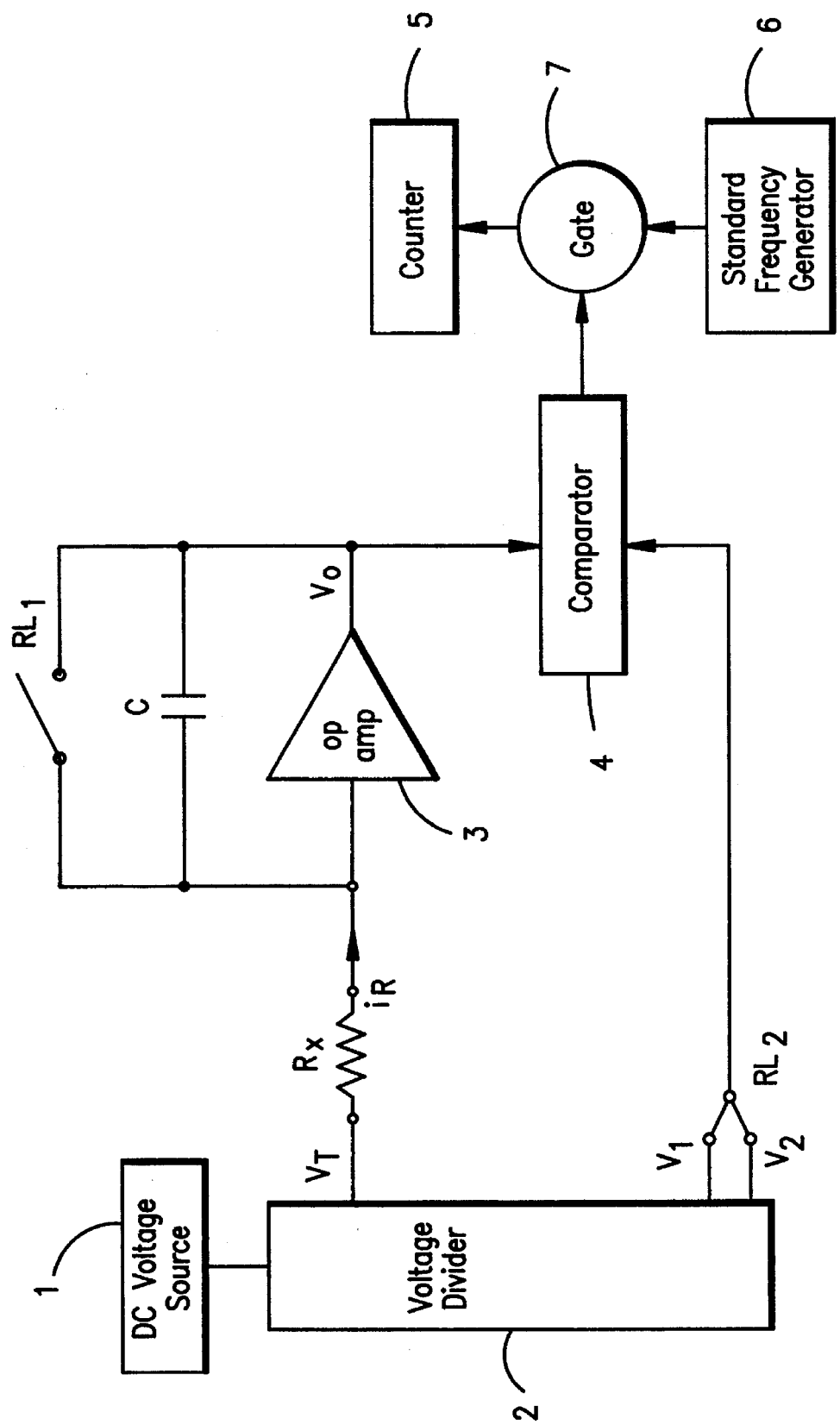
FIG. 1 is a the block diagram of a conventional digital teraohmmeter.
Figure 2:
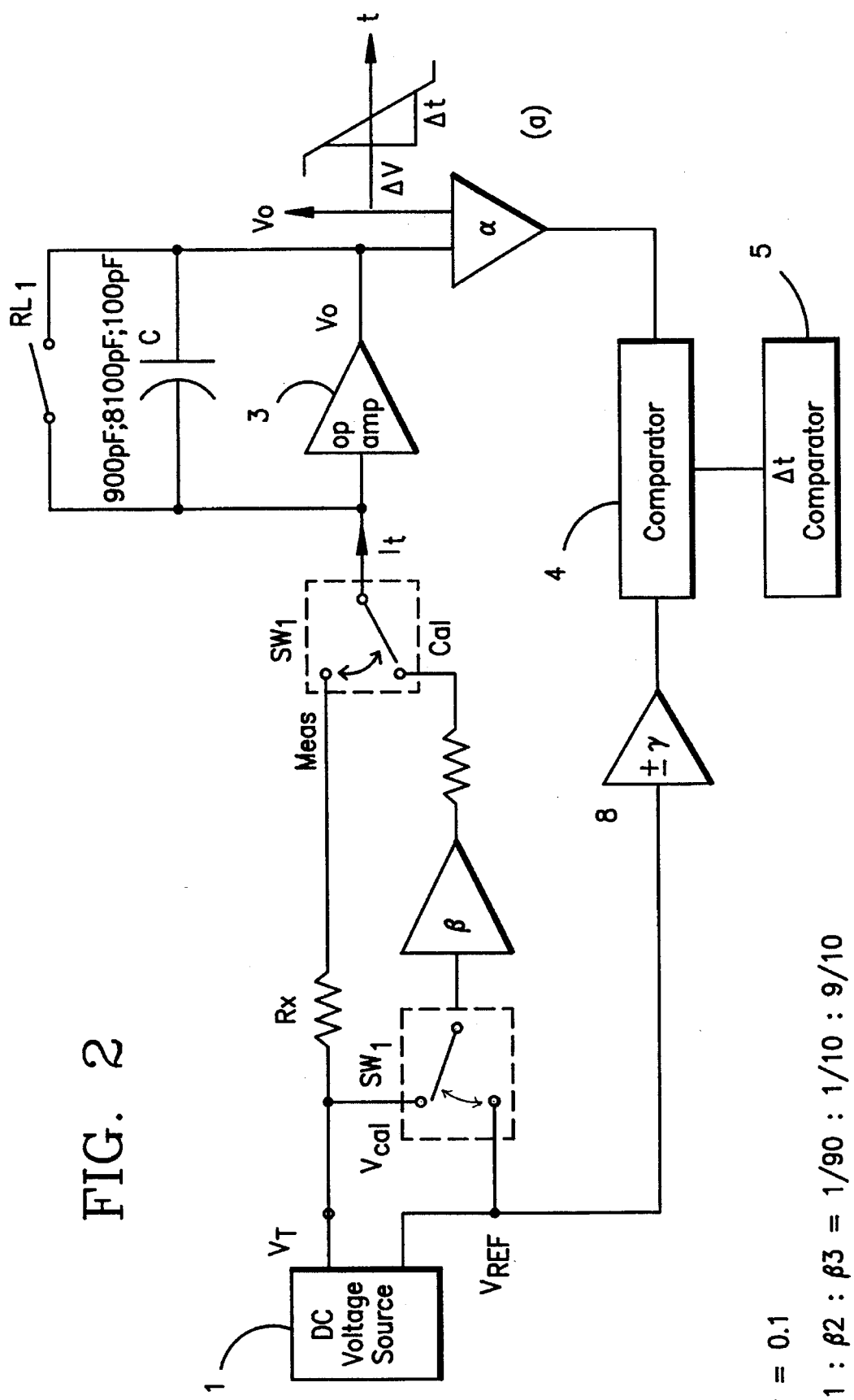
FIG. 2 is a block diagram of an automatic self-calibration system for the digital teraohmmeter of the preferred invention.

FIG. 2 is the block diagram of the automatic self-calibration system for the digital teraohmmeter of the preferred invention. In the figure, components which appear in FIG. 1 are labeled with the same numbers.

3

As shown in FIG. 2, therefore, the automatic self-calibration system for the digital teraohmmeter of this invention comprises a DC voltage source 1, a circuit for providing reference voltages $V_1$ and $V_2$ and a test voltage $V_T$ 2, an operational amplifier 3, a level comparator 4, a counter 5 and a capacitor C settable to three different values; 900, 100 and 8100 pF. The operational amplifier 3 and the capacitor C constitute an integrator. The device of this invention further comprises a first switch $SW_1$ and a second switch $SW_2$, a first amplifier α, a second amplifier β and a third amplifier γ, and a reference standard device whose resistance is $R_S$. $R_X$ represents the resistor to be measured.

In this embodiment of the invention, the gain ratio of the first amplifier α is: α1:α2:α3=1/9:1:9; of the second amplifier β is: β1:β2:β3=1/90:1/10: 9/10; and of the third amplifier γ is ±1.

In the measurement procedure, the input voltage $V_T$ is provided by the DC voltage source 1. The first switch $SW_1$ is set at the "Meas" position in FIG. 2. The resistance $R_X$ will be measured according to the process as described above.

The automatic self-calibration system for the digital teraohmmeter of this invention not only measures the resistance $R_X$ but also the capacitance of the capacitor C. The capacitance of the capacitor C may then be used to calibrate the digital teraohmmeter.

The following is a description of the self-calibration method of this invention:

A. External Calibration

In the automatic self-calibration system for a digital teraohmmeter of this invention, a built-in standard resistor $R_S$ is provided. The standard resistor $R_S$ comprises nine 10 MΩ resistors. When the external calibration is operated, the nine 10 MΩ resistors are connected in parallel and the total resistance is equal to 1.1 MΩ. After the external calibration, the nine resistors are connected in series to make the total resistance 90 MΩ, for self-calibration. The external calibration of the standard resistor generally takes place once a year at a 1 MΩ level.

B. Self-Calibration.

The self-calibration of the teraohmmeter is operated before the measurement of the resistor $R_X$ takes place. The automatic self-calibration system of this invention enables the calibration of the capacitor C and the linearity of the teraohmmeter from time to time.

During the self-calibration, the second switch $SW_2$ is set at the "$V_{cal}$" position and the first switch $SW_1$ at the "Cal" position. The testing voltage $V_T$ is set equal to $V_{REF}$ and is converted into a 1 V voltage at the second operational amplifier β. The 1 V voltage is then applied to the standard resistor $R_S$ (90 MΩ) and an input current of 11 nA is generated.

The testing voltage $V_{REF}$ reaches the operational amplifier 3 via the second switch $SW_2$, the second amplifier β, the standard resistor $R_S$ and the first switch $SW_1$. The integrating operation takes place at the output terminal of the operational amplifier 3 and the actual capacitance C of the capacitor C may be calculated according to the integrating time dt of the operational amplifier 3.

In the embodiment of this invention, the standard resistor $R_S$ is a 9×10 MΩ resistor.

4

C. Calibration Procedure

Figure 3:
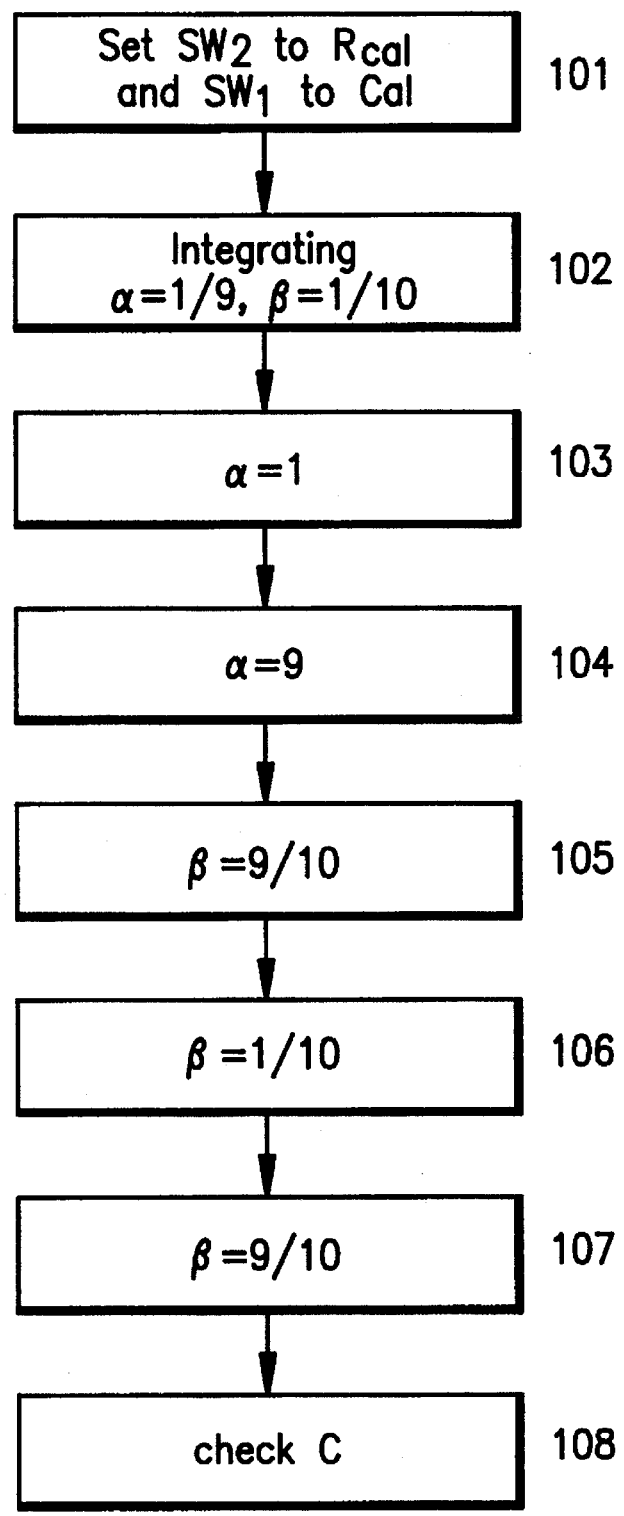
FIG. 3 is a flow chart of the self-calibration method for the digital teraohmmeter of the preferred invention.

FIG. 3 is a flow chart of the automatic self-calibration method for digital teraohmmeter of this invention. Table I records the self-calibration procedure and the results. The following is a description of the procedure according to Table I and FIG.3

In the illustrated process, the standard resistor is a 90 MΩ resistor. First, at 101, the second switch $SW_2$ is set at the "$R_{cal}$" position and the first switch $SW_1$ at the "Cal" position. The 11 nA current is provided from $V_{REF}$ to the teraohmmeter (1 V/90 MΩ). At 102, the gain ratio of the first operational amplifier is set to 1/9 (α=1/9). An Integrating operation is processed at the operational amplifier 3, with the capacitance set at 900 pF. and the initial parameters as shown at 1 of Table I are recorded.

At 103, the first switch $SW_1$ and the second switch $SW_2$ are kept at their original positions and the 11 nA current is provided from $V_{REF}$. The gain ratio of the first amplifier is set to 1 (α=1) and the linearity of the measurement system is checked. At 104, all of the other conditions are maintained, but the gain ratio of the first amplifier is accordingly set to 9 (α=9). The linearity of the measurement system is then checked again.

At 105, the gain ratio of the second amplifier β is switched from 1/10 to 9/10 (β=9/10) and the 11 nA current is provided from $V_{REF}$ (1 V/90 MΩ). The capacitor C is then switched from 900 pF to 8100 pF and the integrating operation at the output terminal of the integrator is processed. The integrating time is counted as shown at 4 of Table I.

At 106 the gain ratio of the second amplifier β is switched from 9/10 to 1/10 but the other factors are kept unchanged. The integrating time dt is counted to make sure that although the slew rate (slew rate=$dV_0$/dt) is reduced, the operation of the device remains accurate. The result is shown at 5 of Table I. At 107 the gain ratio of the second amplifier β is set to 9/10 and the capacitance of the capacitor C is set to 900 pF. the integrating time to check the slew rate is measured again with the being result shown at 6 of Table I. Finally, at 108, the capacitance of the capacitor C is set to 100 pF and the integrating time is measured to make sure that the capacitance is 100 pF. The result is shown at 7 of Table I.

After all the above steps, the functionality of all the key components are verified and the values of dt under different conditions are obtained. The system may use the dt values to calibrate the capacitance of the capacitor C in accordance with Equation I, as follows:

$$R_X = \frac{V_T}{dV_0} \cdot \frac{dt}{C}. \tag{1}$$

The calibration process is similar to that of the measurement process.

In Equation I, the value of $V_T$ is $V_{REF}$, $dV_0$ is 1 * $V_{REF}$ or 2 * $V_{REF}$. As a result, the errors in the measurement of $V_{REF}$ may be counterbalanced in the equation. Since $R_X$ is known and dt is known, we have:

$$C = \frac{V_T}{dV_0} \cdot \frac{dt}{R_S}. \tag{2}$$

The self-calibration process as described above may be controlled by a computer program. The calibration may be operated at any time during the measurement process of the teraohmmeter.

EFFECTS OF THE INVENTION

As described above, in the automatic self-calibration system for a digital teraohmmeter of the preferred invention, a built-in standard resistor is provided and the self-calibration of the system may be controlled by a computer. Accurate measurement of high-resistance is obtained.

It is to be understood that the above-described embodiment is merely an illustrative example of the invention and that numerous variations may be made by those skilled in the art without departing from the scope of the invention. It is, intended that all Such variations be included within the scope of the invention to the extent defined by the appended claims.

TABLE I

| No. | $I_T$(nA) | C(pF) | $dV_0$(v) | dt(s) | $dV_0$/dt(v/s) | Remarks |
|---|---|---|---|---|---|---|
| 1 | 11 | 900 | 18.0 | 1.47 | 12.2 | Calibrate with $R_S$ |
| 2 | 11 | 900 | 2.00 | 0.16 | 12.2 | Check linearity |
| 3 | 11 | 900 | 0.22 | 0.02 | 12.2 | Check linearity |
| 4 | 100 | 8100 | 18.0 | 1.46 | 12.3 | Find $C_{8100}/C_{900}$ |
| 5 | 11 | 8100 | 18.0 | 13.2 | 1.36 | Check slew rate |
| 6 | 100 | 900 | 18.0 | 0.16 | 111 | Check slew rate |
| 7 | 11 | 100 | 18.0 | 0.16 | 110 | $C_{100}/C_{900}$ determination |

We claim:

1. A high resistance measurement device with self-calibration function, comprising:

a DC voltage source to supply testing voltage;

a resistance measurement site to be electrically connected to a high resistance to be measured; and an integrating circuit, positioned at the downstream side of said resistance measurement site, comprising: a capacitor, an operational amplifier, a level comparator, a counter to count the integrating time of said integrating circuit at a first level changing to a second level and a calculating means to calculate the resistance of said high resistance to be measured according to the integrating time counted by said counter;

characterized in that said high resistance measurement device further comprises a reference resistor connected to said resistance measurement site by a switch so that the reference resistor can be connected to the integration circuit in place of a high resistance to be measured in order to select the connection of said DC power supply to said resistance measurement site or to said reference resistor, and a capacitance measurement means to measure the capacitance of said capacitor according to a given resistance of said reference resistor.

2. The device according to claim 1 wherein said calculating means uses the following equation to calculate the resistance of said high resistance to be measured:

$$R_X = \frac{V_T}{dV_0} \cdot \frac{dt}{C} \; ;$$

wherein $R_X$ represents the resistance of said high resistance to be measured, $V_T$ represents the input voltage of said resistance measurement site, $dV_0$ represents the standard voltage difference of said operational amplifier, dt represents the integrating time and C represents the capacitance of said capacitor.

3. The device according to claim 1 or 2 wherein said capacitance measurement means calculates the capacitance of said capacitor according to the following equation:

$$C = \frac{V_T}{dV_0} \cdot \frac{dt}{R_S} \; ,$$

wherein C represents the capacitance of said capacitor, $V_T$ represents the input voltage of said resistance measurement site, $dV_0$ represents the standard voltage difference of said operational amplifier, dt represents the integrating time and $R_S$ represents the resistance of said reference resistor.

4. The device as claimed in claim 3, further comprising a measurement controller to control said switch to connect said DC power supply to said reference resistor, to have said capacitance measurement means to measure the capacitance of said capacitor, to supply said capacitance value to said calculation means and to control said switch to connect said DC voltage source to said resistance measurement site.

5. A method for calibrating a high-resistance measurement device, to be operated in a device comprising:

a DC voltage source;

a resistance measurement site to be electrically connected to a high resistance to be measured;

an integrating circuit, positioned at the downstream side of said resistance measurement site, comprising: a capacitor, an operational amplifier and a counter to count the time of said integrating circuit changing from a first level to a second level; and a calibration means comprising: a reference resistor connected in parallel to said resistance measurement site and a capacitance measurement means including at least a first to measure the capacitance of said capacitor according to a given resistance of said reference resistor;

comprising the following steps:

calculating a first capacitance of said capacitor according to the integrating time counted by said counter;

checking the linearity of said measurement device by changing the capacitance of said capacitor to a second capacitance;

checking the slew rate of said measurement device by changing the capacitance of said capacitor to the first capacitance; and checking the capacitance of said capacitor again by changing the capacitance of said capacitor to a third capacitance.

6. The method according to claim 5 wherein said capacitance measurement means calculates the capacitance of said capacitor according to the following equation:

$$C = \frac{V_T}{dV_0} \cdot \frac{dt}{R_S} \; ,$$

wherein C represents the capacitance of said capacitor, $V_T$ represents the input voltage of said resistance measurement site, $dV_0$ represents the standard voltage difference of said operational amplifier, dt represents the integrating time and $R_S$ represents the resistance of said reference resistor.

7. The method as claimed in claim 5 or 6, further comprising:

connecting said DC voltage source to said reference resistor before calculating the capacitance of said capacitor; and connecting said DC voltage source to said resistance measurement site after the capacitance of said capacitor is calibrated.

* * * * *